US012666926B2

(12) United States Patent
Das et al.

(10) Patent No.: US 12,666,926 B2
(45) Date of Patent: Jun. 23, 2026

(54) ANODIZATION FOR METAL MATRIX COMPOSITE SEMICONDUCTOR PROCESSING CHAMBER COMPONENTS

(71) Applicant: Lam Research Corporation, Fremont, CA (US)

(72) Inventors: Debanjan Das, Bengaluru (IN); Eric Samulon, Oakland, CA (US); Darrell Ehrlich, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 505 days.

(21) Appl. No.: 18/011,103

(22) PCT Filed: Aug. 23, 2021

(86) PCT No.: PCT/US2021/047164
§ 371 (c)(1),
(2) Date: Dec. 16, 2022

(87) PCT Pub. No.: WO2022/046643
PCT Pub. Date: Mar. 3, 2022

(65) Prior Publication Data
US 2023/0343627 A1 Oct. 26, 2023

Related U.S. Application Data

(60) Provisional application No. 63/070,722, filed on Aug. 26, 2020.

(51) Int. Cl.
| | |
|---|---|
| *H10P 72/76* | (2026.01) |
| *H01J 37/32* | (2006.01) |
| *H10P 72/00* | (2026.01) |

(52) U.S. Cl.
CPC .... *H10P 72/7616* (2026.01); *H01J 37/32715* (2013.01); *H01J 37/32807* (2013.01); *H01J 2237/3341* (2013.01); *H10P 72/0421* (2026.01)

(58) Field of Classification Search
None
See application file for complete search history.

(56) References Cited

U.S. PATENT DOCUMENTS

| | | | |
|---|---|---|---|
| 4,417,954 A | 11/1983 | Birkle et al. | |
| 8,282,987 B2 | 10/2012 | Kenworthy et al. | |
| 9,476,137 B2 | 10/2016 | Ohmi et al. | |
| 9,624,593 B2 | 4/2017 | Sun et al. | |

| | | | |
|---|---|---|---|
| 2003/0165043 A1 | 9/2003 | Logan et al. | |
| 2004/0002221 A1 | 1/2004 | O'Donnell et al. | |
| 2012/0132532 A1 | 5/2012 | Kenworthy et al. | |
| 2016/0236445 A1* | 8/2016 | Kang | B32B 37/18 |

FOREIGN PATENT DOCUMENTS

| | | | | |
|---|---|---|---|---|
| EP | 1944800 | | 7/2008 | |
| EP | 3283673 | | 2/2018 | |
| JP | 10-032239 | | 2/1998 | |
| JP | 2004018927 A | * | 1/2004 | |
| JP | 2007217746 A | * | 8/2007 | |
| JP | 2008-053315 | | 3/2008 | |
| JP | 2008-153315 | | 7/2008 | |
| JP | 2010-522989 | | 7/2010 | |
| JP | 2016-529404 | | 9/2016 | |
| KR | 10-2008-0055646 | | 6/2008 | |
| KR | 10-2010-0016019 | | 2/2010 | |
| WO | 2006/134737 | | 12/2006 | |
| WO | 2021/146098 | | 7/2021 | |

OTHER PUBLICATIONS

Kitabayashi et al., JPH1032239A, Feb. 3, 1998 (machine translation) (Year: 1998).*
Yamaguchi, JP-2004018927-A, Jan. 22, 2004 (machine translation) (Year: 2004).*
Tsuto, JP-2007217746-A, Jan. 22, 2004 (machine translation) (Year: 2007).*
Scamans, Corrosion of Aluminum and its Alloys, 2010, pp. 1974-2010 (Year: 2010).*
International Search Report and Written Opinion from International Application No. PCT/US2021/047164 dated Dec. 15, 2021.
Gustavo R. Vallejo and David D. Dayton. "Ultra High Purity Electroplated Aluminum Coatings for Critical Components in Dry Etch and Process Chamber Environments." AlumiPlate, Jun. 2015.
Korean Office Action from Korean Application No. 10-2023-7006719 dated Mar. 21, 2025 with Machine Translation.
Japanese Notice of Refusal from Japanese Application No. 2023-512285 dated Jun. 17, 2025.

* cited by examiner

*Primary Examiner* — Cheng Yuan Huang
(74) *Attorney, Agent, or Firm* — Beyer Law Group LLP

(57) ABSTRACT

A component of a semiconductor processing chamber formed of a metal matrix component having an anodized layer on a surface thereof. The anodized layer comprises an aluminum oxide layer and is formed over an AlSic component. The anodized layer provides the component with protection against corrosion due to plasma processing gases, as the anodized layer provides a protective coating. A layer of aluminum is plated over a surface of the component and the aluminum layer is subsequently anodized to form the protective layer.

13 Claims, 5 Drawing Sheets

ANODIZATION FOR METAL MATRIX COMPOSITE SEMICONDUCTOR PROCESSING CHAMBER COMPONENTS

REFERENCE TO RELATED APPLICATIONS

This application claims the benefit of U.S. Provisional Patent Application No. 63/070,722, filed on Aug. 26, 2020. The foregoing application is hereby incorporated by reference herein for all purposes.

BACKGROUND

The present disclosure generally relates to the manufacturing of semiconductor devices. More specifically, the disclosure relates to chamber components used in manufacturing semiconductor devices.

During semiconductor wafer processing, plasma processing chambers are used to process semiconductor devices. Plasma processing chambers are subjected to plasmas, which may degrade components in the plasma processing chambers. For example, an electrostatic chuck (ESC) baseplate is a critical component of an etching chamber as a part of the subsystem upon which the wafer sits. A metal matrix composite material can be used as the baseplate substrate to improve the reliability of plasma spray coated substrates operating over a wide temperature range, as the electrostatic chuck may be subjected to corrosive plasma and high electrostatic potentials.

Anodization is used as an economical pathway to protect components, such as a baseplate substrate, from the extreme nature of the processing chamber, including from plasma erosion and mechanical galling. However, standard anodization techniques have been proven to be unsuccessful in metal composite structures due to the leaky and porous nature of the metal composite material. The entrapment of metal in the metal composite material prevents a uniform anodized film from growing, which leads to an uneven and unreliable anodic natural oxide film having poor corrosion protection in plasma environments. The presence of reinforcement particles at the surface of the metal composite structure also prevents a seamless continuous formation of a barrier oxide layer by reducing the efficacy of the anodizing process. Thus, in order to form a semiconductor processing chamber component that is more resistant to corrosive plasma materials, it would be desirable to be able to form a protective coating, such as a uniform anodized layer, over a metal matrix composite component.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

According to an embodiment, a component in a semiconductor processing chamber is provided. The component includes a body comprising a metal matrix composite and an anodized layer over the body.

According to another embodiment, a method is provided for forming an anodized layer of a body comprising a metal matrix composite. The body comprising the metal matrix composite is provided. A layer of aluminum is plated over a surface of the body, wherein the aluminum is at least 99% pure aluminum by mass. The layer of aluminum is anodized to form an anodized layer.

According to yet another embodiment, an anodized layer of a body comprising a metal matrix composite in a semiconductor processing chamber is provided. The body comprising the metal matrix composite is provided. A layer of aluminum is plated over a surface of the body, wherein the aluminum is at least 99% pure aluminum by mass. The layer of aluminum is anodized to form an anodized layer.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well-known process steps and/or structures have not been described in detail in order to not unnecessarily obscure the present disclosure.

A metal matrix composite is a desirable component material for plasma processing chamber components. Metal matrix composite material may be used for plasma chamber components, such as ESC baseplates. However, the metal parts of an ESC can be subjected to large voltages as compared to the chamber body. There is a need to protect the metal parts of ESCs from chemical degradation and electrical discharge. Etch-resistant coatings can provide additional protection to such plasma chamber components. A metal matrix composite material is a composite material that is formed by dispersing a reinforcing material (metal or non-metal such as a ceramic or organic compound) into a matrix of a continuous solid phase monolithic metal material.

Current protective coatings on ESC baseplates include anodized layers, ceramic spray coats, or a spray coat over an anodized layer. An aluminum nitride coating grown directly on the surface of aluminum baseplates is used in some products. Anodization breaks down at approximately 2 kilovolts (kV) on a 0.002 inch thick coating when formed on a flat surface of aluminum, and at 600 volts (V) on corner radii. Spray coating, if applied normal to the surface, will withstand up to 10 kV on flat surfaces, but only up to about 4-5 kV on corner radii. Spray coats can be sealed with polymers, but all known effective sealing methods will degrade, when exposed to, in particular, fluorine containing plasmas under chamber operating conditions. Existing technology reaches its limits at these values since attempts to further improve the breakdown by making thicker coatings lead to cracking in response to thermal cycling, due to a mismatch between the coefficient of thermal expansion (CTE) of the substrate and the CTE of coating materials.

Figure 1:
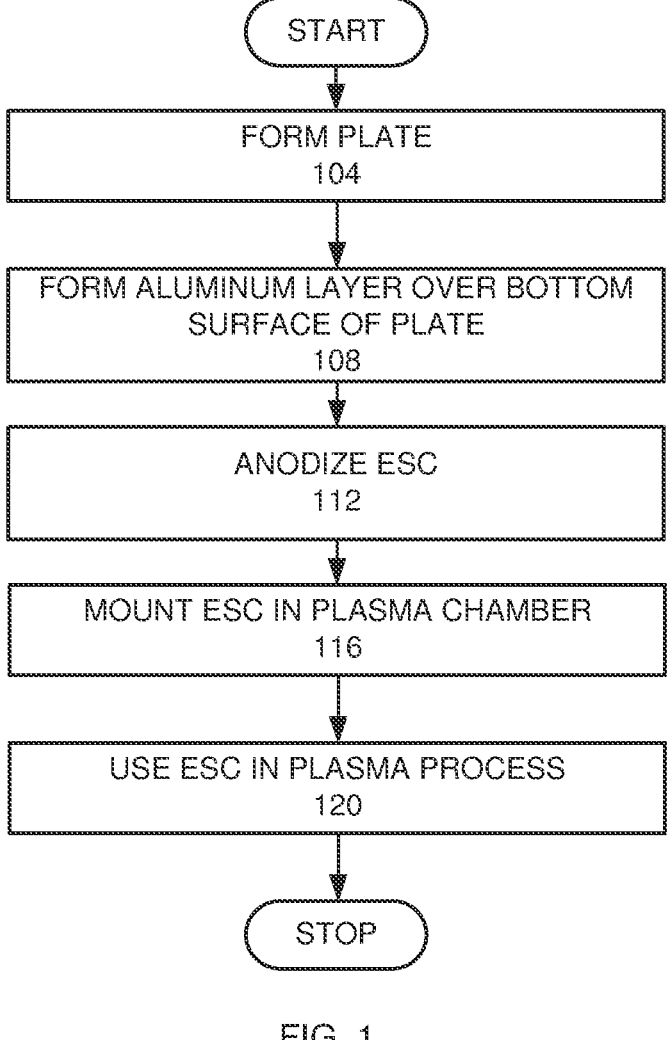
FIG. 1 is a high level flow chart of an embodiment for providing an ESC system.
Figures 2A, 2B, 2C:
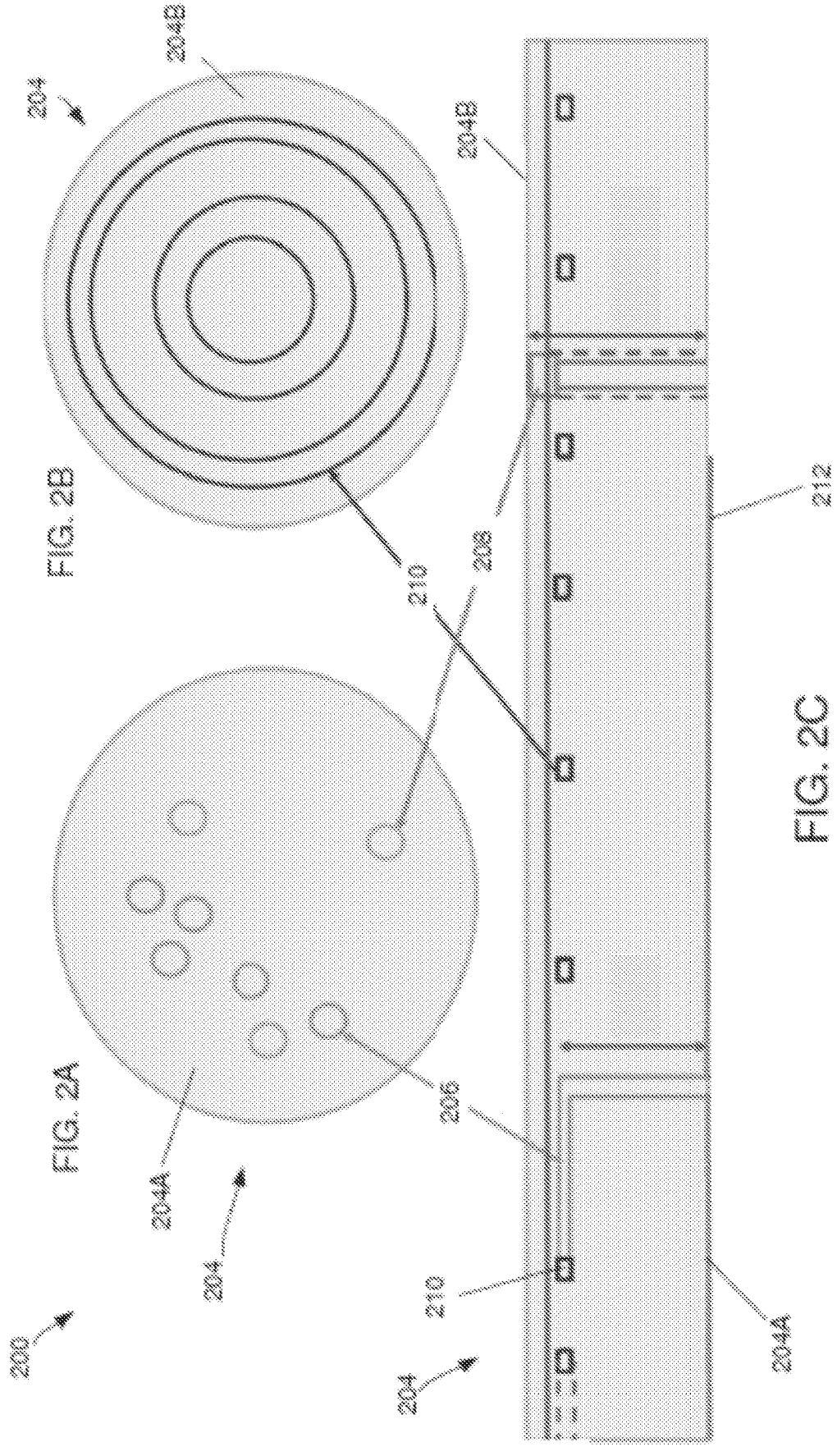
FIG. 2A is a bottom view of a plate used in an ESC system in accordance with an embodiment.
FIG. 2B is a top view of the plate shown in FIG. 2A.
FIG. 2C is a cross-sectional side view of the plate shown in FIGS. 2A and 2B.

Various embodiments described herein provide ESCs that are resistant to damage by arcing and/or erosion by plasma etching. To facilitate understanding, FIG. 1 is a high-level flow chart of an embodiment for providing an ESC system. A plate is formed (step 104). FIG. 2A is a bottom view of a plate 204 used in an ESC system 200 provided in an embodiment. The bottom view of the plate 204 shows a first side of the plate 204. The first side of the plate 204 in this embodiment is a flat surface.

In this embodiment, the plate 204 is formed of a metal matrix composite. According to an embodiment, the metal matrix composite is aluminum—silicon carbide (AlSiC) comprising an aluminum matrix with dispersed silicon carbide (SiC) particles, fibers, or whiskers. AlSiC comprises silicon carbide dispersed in a continuous solid phase monolithic aluminum matrix. According to an embodiment, the plate 204 formed of AlSiC comprises silicon carbide in a range of 30-75% by volume. According to another embodiment, the plate 204 formed of AlSiC comprises silicon carbide in a range of 40-60% by volume. An ESC system 200 made using a plate 204 formed of AlSiC has significant advantages over previous baseplate technology. AlSiC provides a balance of low CTE with high thermal conductivity.

The plate 204 comprises a plurality of internal gas passages 206, 208. Each of the gas passages 206, 208 has an outlet on the bottom surface 204A or underside of the plate 204. Both gas channel holes 206 and through holes 208 are shown in the bottom view of the plate 204, as shown in FIG. 2A. FIG. 2B is a top view of the plate 204 showing coolant channels 210 in the top surface 204B of the plate 204. Wafer backside cooling gas is able to flow through the cooling gas distribution channels 210 in a direction substantially parallel to the surface of the first side of the plate 204. In some embodiments, the wafer backside cooling gas is helium.

FIG. 2C is a side view of the plate 204 of the ESC system 200. As shown in FIG. 2C, the gas through holes 208 extend all the way through to the top surface 204B of the plate 204. Each of the gas channel holes 206 extends into and terminates in a cooling gas distribution channel 210.

After the plate 204 is formed and provided (step 104), an aluminum layer 212 is formed over a bottom surface 204A of the plate 204 (step 108), as shown in FIG. 2C. The aluminum layer 212 is plated over the bottom surface 204A of the plate 204 and the inner surfaces of the gas passages 206, 208.

According to an embodiment, the aluminum layer 212 is plated to form a cladding layer on the metal matrix composite plate 204. According to some embodiments, the aluminum layer 212 is deposited using a deposition method, such as atomic layer deposition (ALD) or plasma electrolytic oxidation (PEO). This aluminum layer 212 helps aid the formation of an anodized oxide top layer 214 (described below) that is more uniform, has minimal porosity, and has lower trace contaminants compared to standard anodization. This anodized layer 214 is a corrosion resistance barrier against aggressive plasma environments and also provides voltage standoff protection from the high voltage plasma environment. According to an embodiment, the aluminum layer 212 is at least 99% pure aluminum by mass. According to another embodiment, the aluminum layer 212 is at least 99.5% pure aluminum by mass. According to yet another embodiment, the aluminum layer 212 is at least 99.9% pure aluminum by mass.

Figures 3A, 3B:
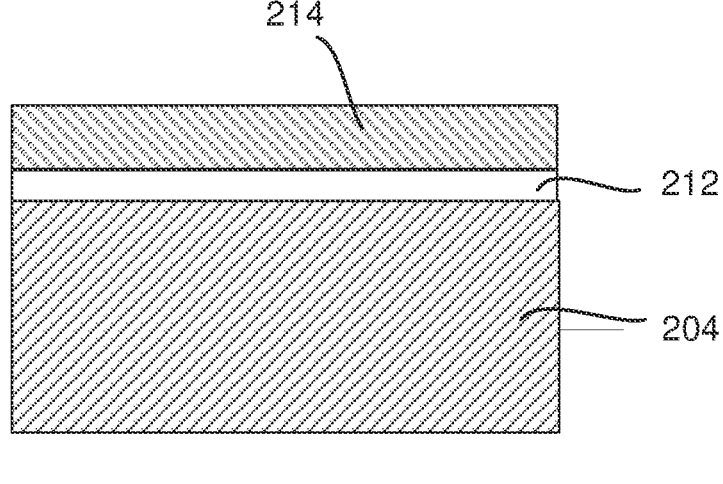
FIG. 3A is a cross-sectional view of a portion of the plate after anodization in accordance with an embodiment.
FIG. 3B is a cross-sectional view of a portion of the plate after anodization in accordance with another embodiment.

After the aluminum layer 212 is formed, the ESC system 200 (including the plate 204) is anodized (step 112), forming an anodized oxide layer 214. FIG. 3A is a cross-sectional view of an embodiment of a portion of the plate 204 after anodization, showing the anodized oxide layer 214. As shown in FIG. 3A, in some embodiments, the anodized oxide layer 214 is at least 10 microns thick and can be as thick as 50 microns. In other embodiments, the anodized oxide layer 214 has a thickness in a range of 25-50 microns. In some embodiments, after anodization, the aluminum layer 212 is less than 10 microns thick. According to some embodiments, the thickness of the aluminum layer 212 is at least ⅓ the thickness of the anodized layer 214 after anodization.

In other embodiments, after anodization, there is no aluminum layer between the anodized oxide layer 214 and the plate 204, as shown in FIG. 3B, as the entire aluminum layer 212 is anodized in the anodization process. According to an embodiment, the bottom surface of the plate 204 has at least one opening to a gas passage 206, 208 and the anodized layer 214 is also formed over a surface of an interior of the gas passage 206, 208. It will be understood that in some embodiments having more than one gas passage 206, 208, the anodized layer 214 is also formed over a surface of an interior of each of the gas passages 206, 208.

According to an embodiment, the anodized oxide layer 214 is an aluminum oxide layer with a purity of at least 99% aluminum oxide by mass. According to another embodiment, the anodized oxide layer 214 is an aluminum oxide layer with a purity of at least 99.5% aluminum oxide by mass. According to yet another embodiment, the anodized oxide layer 214 is an aluminum oxide layer with a purity of at least 99.9% aluminum oxide by mass. The anodized layer 214 has a porosity of not more than 0.5% by volume. In some embodiments, the porosity of the anodized layer 214 is in a range of 0.1%-0.5% by volume.

The ESC system 200 is then mounted in a plasma processing chamber (step 116). In an embodiment, a ceramic plate is placed over the plate 204. A gas source is placed in fluid connection with the gas apertures 208. In this embodiment, the gas source provides helium. The helium is provided to transfer heat between the ceramic plate and the plate 204. A coolant source is placed in fluid connection with the coolant channels 224. The coolant source provides a coolant to control the temperature of the ESC system 200. The ESC system 200 supports a substrate that is to be processed. The ESC system 200 is used in plasma processing a substrate (step 120). The ESC system 200 supports the substrate during the process, and is exposed to plasma and high electrical potentials during processing.

Forming the aluminum layer 212 on the plate 204 provides a layer 212 that can be anodized to form a corrosion-resistant aluminum oxide layer 214. The aluminum oxide layer 214 formed by anodization provides an improved protective layer, including on more complex shapes, such as the interior of the gas passages 206, 208. The improved protective aluminum oxide layer 214 is more resistant to arcing and other damage, such as corrosion from plasma etching.

Figure 3C:
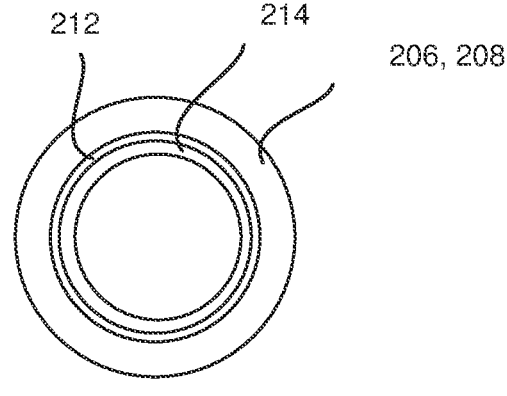
FIG. 3C is an enlarged cross-sectional view of a gas passage after anodization in accordance with an embodiment.
Figure 3D:
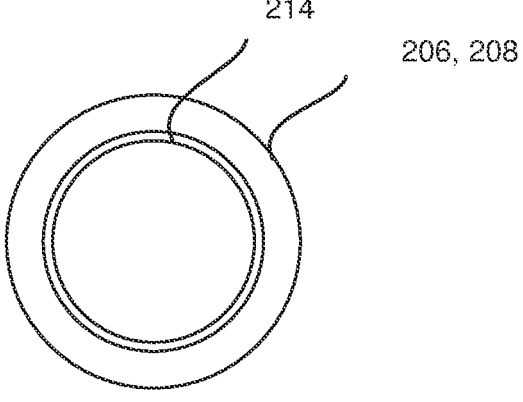
FIG. 3D is an enlarged cross-sectional view of a gas passage after anodization in accordance with another embodiment.

The plated aluminum layer 212 allows for coating surfaces such as the inner surfaces of the gas passages 206, 208, that would be otherwise difficult to coat, as anodization of the aluminum layer 212 forms the protective aluminum oxide layer 214. FIG. 3C is an enlarged cross-sectional view of an embodiment of a gas passage 206, 208 with a protective aluminum oxide layer 214 over a substantially pure aluminum layer 212 on an inner surface of the gas passage 206, 208. FIG. 3D is an enlarged cross-sectional view of another embodiment of a gas passage 206, 208 with a protective aluminum oxide layer 214 on an inner surface of the gas passage 206, 208. In the embodiment shown in FIG. 3D, there is no aluminum layer between the aluminum oxide layer 214 and the gas passage 206, 208 because the entire aluminum layer was anodized in the anodization process.

Unlike metal alloys, the substantially pure aluminum (at least 99% pure aluminum by mass) that is anodized reduces the inherent risk of contamination. The subsequent anodization quality of the aluminum oxide layer 214 is highly improved by eliminating defects and voids in the surface oxide layer. The high purity aluminum material also provides an added benefit of significantly reduced plasma etch chamber contamination from substrates or in the anodized layer. This superior structure leads to the improvements in corrosion, dielectric and abrasion performance compared to a standalone standard acid anodization on metal matrix composites.

Figure 4:
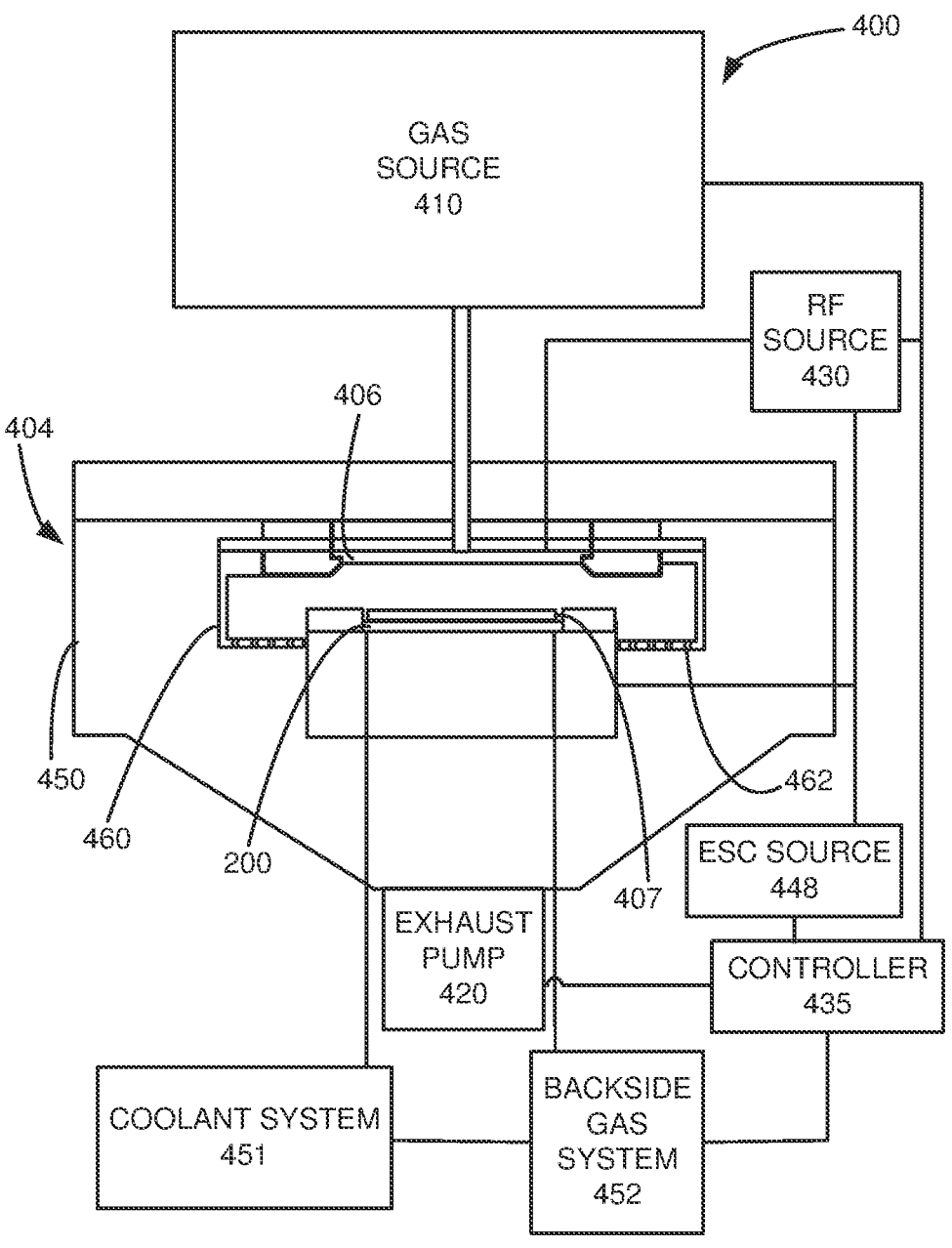
FIG. 4 is a schematic view of a plasma processing system for plasma processing substrates.

FIG. 4 is a schematic view of a plasma processing system 400 for plasma processing substrates, where the component may be installed in an embodiment. In one or more embodiments, the plasma processing system 400 comprises a gas distribution plate 406 providing a gas inlet and the ESC system 200, within a plasma processing chamber 404, enclosed by a chamber wall 450. Within the plasma processing chamber 404, a substrate 407 is positioned on top of the ESC system 200. An ESC power source 448 may provide a bias power to the ESC system 200. A gas source 410 is connected to the plasma processing chamber 404 through the gas distribution plate 406. A coolant system 451 is in fluid connection with the cooling gas distribution channels 210 of the ESC system 200 and provides temperature control of the ESC system 200. A backside gas system 452 is in fluid connection with the gas passages 206, 208. In this embodiment, the backside gas system 452 provides a flow of helium. A radio frequency (RF) power source 430 provides RF power to the ESC system 200 and an upper electrode. In this embodiment, the upper electrode is the gas distribution plate 406. In a preferred embodiment, 13.56 megahertz (MHz), 2 MHz, 60 MHz, and/or optionally, 27 MHz power sources make up the RF power source 430 and the ESC power source 448. A controller 435 is controllably connected to the RF power source 430, the ESC power source 448, an exhaust pump 420, and the gas source 410. A high flow liner 460 is a liner within the plasma processing chamber 404. The high flow liner 460 confines gas from the gas source and has slots 462. The slots 462 maintain a controlled flow of gas to pass from the gas source 410 to the exhaust pump 420. An example of such a plasma processing chamber is the Exelan Flex® etch system manufactured by Lam Research Corporation of Fremont, CA. The process chamber can be a CCP (capacitively coupled plasma) reactor or an ICP (inductively coupled plasma) reactor.

The plasma processing chamber 404 is used to plasma process the substrate 407. The plasma processing may be one or more processes of etching, depositing, passivating, or another plasma process. The plasma processing may also be performed in combination with nonplasma processing. Such processes may expose the ESC system 200 to plasmas containing halogen and/or oxygen.

While this disclosure has been described in terms of several preferred embodiments, there are alterations, permutations, modifications, and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, and various substitute equivalents as fall within the true spirit and scope of the present disclosure.

What is claimed is:

1. A component in a semiconductor processing chamber, the component comprising:
   a body comprising a metal matrix composite; and
   an anodized layer over the body, wherein the component is an electrostatic chuck baseplate and further comprises a plurality of internal gas passages, wherein each internal gas passage has a surface comprising the anodized layer and each internal gas passage has an outlet on an underside of the baseplate.

2. The component as recited in claim 1, wherein the metal matrix composite comprises AlSiC.

3. The component as recited in claim 1, further comprising an aluminum layer between the body and the anodized layer.

4. The component as recited in claim 3, wherein the aluminum layer is at least 99% pure aluminum by mass.

5. The component as recited in claim 3, wherein the aluminum layer is at least 99.5% pure aluminum by mass.

6. The component as recited in claim 3, wherein the aluminum layer is at least 99.9% pure aluminum by mass.

7. The component as recited in claim 2, wherein the AlSiC comprises 30-75% silicon carbide by volume.

8. The component as recited in claim 1, wherein the anodized layer is formed over a bottom surface of the body.

9. The component as recited in claim 1, wherein the anodized layer is an aluminum oxide layer with a purity of at least 99% aluminum oxide by mass.

10. The component as recited in claim 1, wherein the anodized layer has a porosity of 0.1%-0.5% by volume.

11. The component as recited in claim 1, wherein the anodized layer has a thickness in a range of 10-50 microns.

12. The component as recited in claim 10, wherein the anodized layer has a thickness less than 50 microns.

13. The component as recited in claim 10, wherein the anodized layer has a thickness less than 10 microns.

* * * * *